(12) United States Patent
Wu

(10) Patent No.: US 9,829,527 B2
(45) Date of Patent: Nov. 28, 2017

(54) SELF-DETECTION METHOD UTILIZING AN ION GENERATING DEVICE TO DISSIPATE ELECTROSTATIC CAPACITY

(71) Applicant: Yi Jing Technology Co., Ltd., Kaohsiung (TW)

(72) Inventor: Kuan-Ting Wu, Kaohsiung (TW)

(73) Assignee: Yi Jing Technology Co., Ltd, Kaohsiung (TW)

( * ) Notice: Subject to any disclaimer, the term of this patent is extended or adjusted under 35 U.S.C. 154(b) by 47 days.

(21) Appl. No.: 14/562,661

(22) Filed: Dec. 5, 2014

(65) Prior Publication Data

US 2015/0160280 A1 Jun. 11, 2015

(30) Foreign Application Priority Data

Dec. 10, 2013 (TW) .............................. 102145464 A

(51) Int. Cl.
*G01R 31/00* (2006.01)
*H01T 23/00* (2006.01)

(52) U.S. Cl.
CPC ........... *G01R 31/001* (2013.01); *H01T 23/00* (2013.01)

(58) Field of Classification Search
CPC .............................. H01T 23/00; G01R 31/001
See application file for complete search history.

(56) References Cited

U.S. PATENT DOCUMENTS

| | | | | |
|---|---|---|---|---|
| 6,828,794 | B2 * | 12/2004 | Reavell .............. | G01N 15/0266 324/458 |
| 2007/0279829 | A1 * | 12/2007 | Gefter ..................... | H01T 23/00 361/213 |
| 2009/0219663 | A1 * | 9/2009 | Sato ........................ | H01T 23/00 361/220 |
| 2011/0134580 | A1 * | 6/2011 | Suzuki ................... | H01T 23/00 361/212 |
| 2013/0271164 | A1 * | 10/2013 | Savich .............. | G01R 27/2605 324/679 |

* cited by examiner

*Primary Examiner* — Jeff Natalini

(57) ABSTRACT

An ion generating device includes a controller, positive and negative ion generating circuits, an airflow generator, and a detecting element. The controller is preinstalled with a constant of proportionality, controls the positive and the negative ion generating circuits, and the airflow generator directs the ions to a destination. The detecting element detects the balanced voltage of the positive and negative ions at the destination, and responds with the detecting result to the controller. The controller increases or decreases the ion numbers. The variation of the ion numbers is x, and the balanced voltage at the destination is y. The controller compares the function of x and y with the constant of proportionality to determine whether they are similar. If the comparison result is similar, then the electrostatic dissipation capability of the ion generating device is normal.

17 Claims, 5 Drawing Sheets

SELF-DETECTION METHOD UTILIZING AN ION GENERATING DEVICE TO DISSIPATE ELECTROSTATIC CAPACITY

BACKGROUND OF THE INVENTION

1. Field of the Invention

The present invention relates to a self-testing method, and more particularly to a self-testing method of electrostatic dissipation abilities for an ion generating device.

2. Description of the Related Art

The demand for semiconductor products steadily increases, and consumers turn to look for lighter, thinner, shorter and smaller electronic products. Therefore, manufacturers continually seek to minimize the feature size of electronic parts to comply with the demands of the electronic products markets. In addition, manufacturers have to improve their semiconductor manufacturing processes to obtain breakthrough technologies.

The manufacturing costs and added value of semiconductor products are high, and the yield rate of products is a crucial factor in determining the costs of semiconductor chips and other electronic products. Therefore, each phase of the manufacturing process, as well as the semiconductor manufacturing equipment, goes through numerous tests to guarantee the yield rate of finished electronic products.

As the semiconductor manufacturing process reaches the 22 nm or even 20 nm node, the semiconductor products are easily damaged by electrostatic charge. Static electricity arises from ion movements due to contact between objects, which imparts positive or negative charge to an object. Because of electrostatic discharge, small semiconductor products are easily pierced, burned or damaged. Therefore, how to prevent static electricity is an important issue for semiconductor manufacturers to address.

With reference to FIG. 1, illustrating an aspect of Taiwan Invention No. I359235, "Detecting device of an ionic fan for mechanical equipment", mechanical equipment has a central processing unit 23 to control each device, and inside a cover there is at least an ionic fan 24 to dissipate static electricity. The ionic fan 24 is connected to a detecting device 25, and inside the detecting device 25 there is a microprocessor unit 254 and a plurality of detecting units 251. The plural detecting units 251 are connected to the ionic fan 24 by a circuit that can transmit detecting signals from the ionic fan to the microprocessor unit 254. After performing a comparison, the microprocessor unit 254 transmits a detecting result, through the central processing unit 23 to a display unit 231 to display the detecting result.

The prior art detecting device for an ionic fan is convenient for workers to immediately acknowledge and fix malfunctions of the ionic fan external to the mechanical equipment. However, it cannot actively control the number of positive and negative ions output by the ionic fan 24, so the semiconductor manufacturing process is forced to stop and the manufacturing time is impacted.

Because static electricity will not disappear voluntarily, as long as static electricity exists, it can cause damage which can lead to a loss of millions or even ten millions of dollars. To improve the reliability of products and to prevent damage from static electricity, active electrostatic dissipation devices need to be improved.

Therefore, on Jun. 10, 2013, the applicant of this application filed Taiwanese patent, application no. 102120596, entitled "An active sensing feedback ion generating device". The above invention can adjust voltage in accordance with the sensed ion numbers, and respond by adjusting the ion generating device; the device should correspond to the positive and negative ion output numbers to achieve the goal of active sensing and response. However, if the positive and negative ion output function of the ion generating device can not comply with the output requirements (such as due to a contaminated ion discharge needle), although the device will continuously respond with a balanced voltage of ions, it cannot neutralize the electrostatic charge and so the tested semiconductor will still be damaged by static electricity.

To solve this problem, the electrostatic dissipation capability of the ion generating device needs to be examined. However, during examination the semiconductor manufacturing line needs to be stopped, and has to empty out semiconductor products, so the examination will consume much more labor and time. Therefore, it is desirable to provide a detecting method for the electrostatic dissipation capability for an ion generating device without impacting a manufacturing line.

SUMMARY OF THE INVENTION

Therefore, an objective of an embodiment of the present invention is to provide a self-testing method of electrostatic dissipation capability for an ion generating device.

In order to achieve the above mentioned objective, the self-testing method comprises the following steps: : initially, step (a), an ion generating device includes a controller, a positive and a negative ion generating circuit which electrically connect to the controller, an airflow generator, and a detecting element.

In step (b), the controller is preinstalled with a constant of proportionality $k=y/x$, controlling plural positive and negative ions discharged by the positive and the negative ion generating circuits, and the airflow generator can direct the plural positive and negative ions to a destination. Then, in step (c), the detecting element can detect the balanced voltage of positive and negative ions at the destination, and respond with the detecting result to the controller.

In step (d), the controller can control the positive and the negative ion generating circuits to increase or decrease the ion numbers. The variation of the ion number is x, and the balanced voltage at the destination detected by the detecting element which is controlled by the controller is y.

In step (e), the controller compares the function of the variables x and y with the constant of proportionality to determine whether they are similar. Finally, in step (f), if the comparison result is similar, then the electrostatic dissipation capability of the ion generating device is normal. Furthermore, this method can include a step (g), wherein after an interval of time, steps (d) to (e) are repeated.

The advantage of embodiments of the invention is in comparing the variables x and y with the constant of proportionality to examine whether the electrostatic dissipation capability of the ion generating device is normal or not. Besides, during examination, the manufacturing line does not need to stop, and it doesn't have to empty out products, but undergoes examination while manufacturing and thus won't impact the manufacturing line.

DETAILED DESCRIPTION OF THE PREFERRED EMBODIMENT

Specific structural and functional details disclosed herein will become apparent from the following description of the preferred embodiments of the present invention taken in conjunction with the accompanying drawings.

Before explaining the present method in detail, it is to be understood that similar elements are labeled with the same number.

Figure 1:
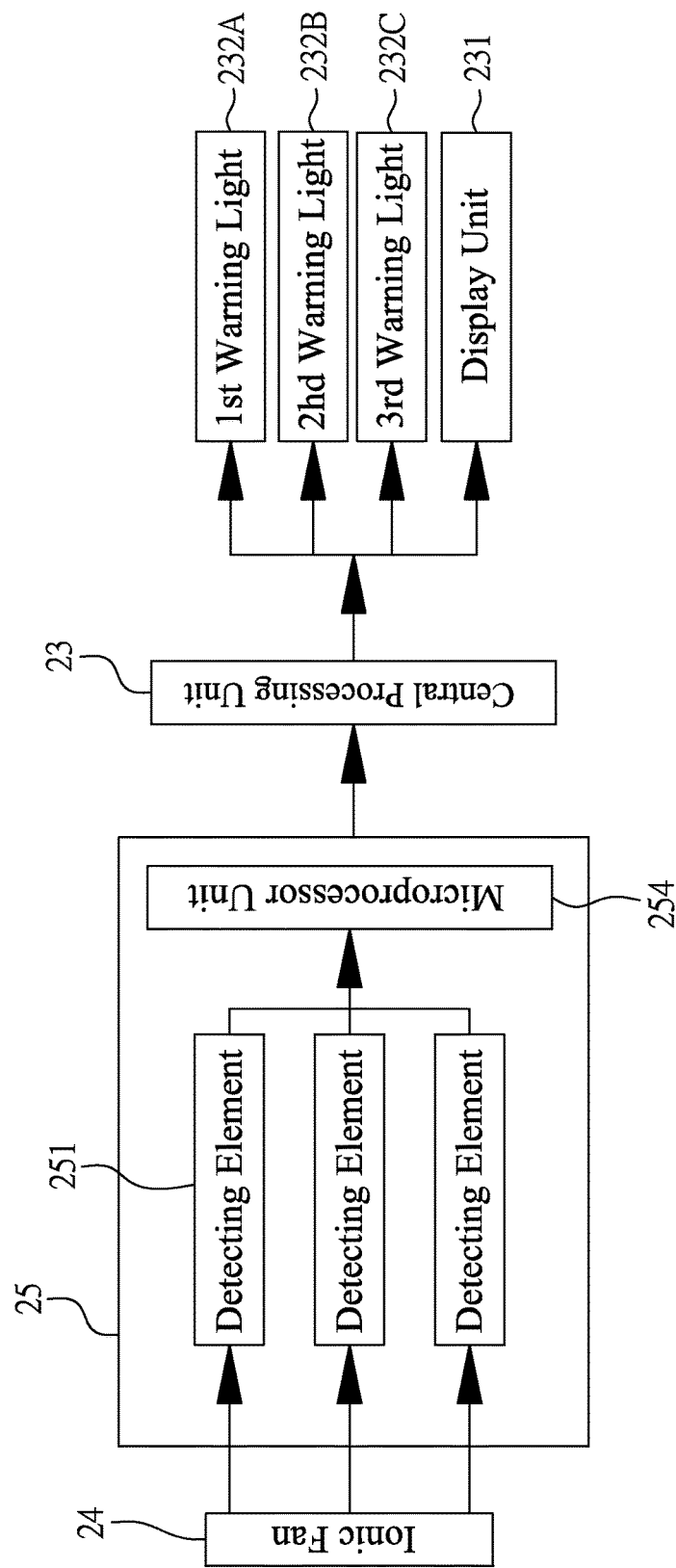
FIG. 1 is a control flow diagram of the prior art from Taiwan Invention No. I359235, showing a detecting device of an ionic fan for mechanical equipment.
Figure 2:
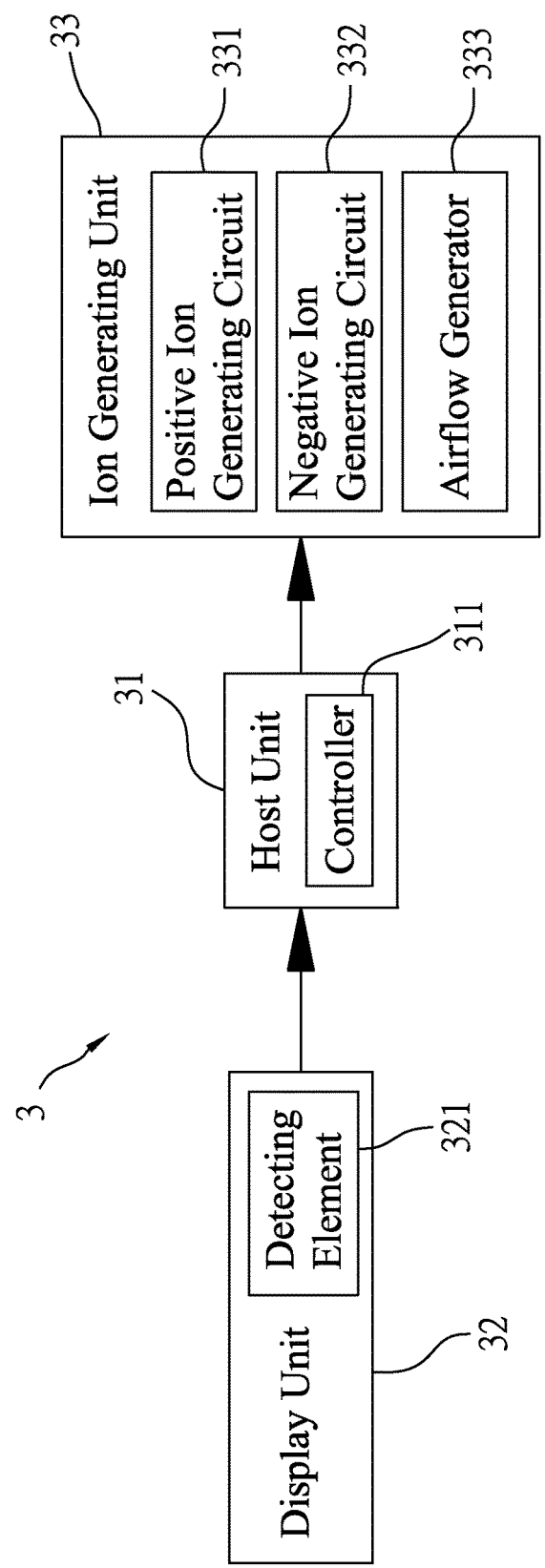
FIG. 2 is a block diagram depicting the main component parts according to an embodiment of the present invention.

With reference to FIG. 2, a first embodiment according to the present invention is depicted. An ion generating device 3 comprises: a host unit 31, a sensing unit 32 electrically connected to the host unit 31, and an ion generating unit 33 electrically connected to the host unit 31. The host unit 31 includes a controller 311, and the sensing unit 32 includes a detecting element 321. The ion generating unit 33 includes a positive ion generating circuit 331, a negative ion generating circuit 332, and an airflow generator 333.

Figure 3:
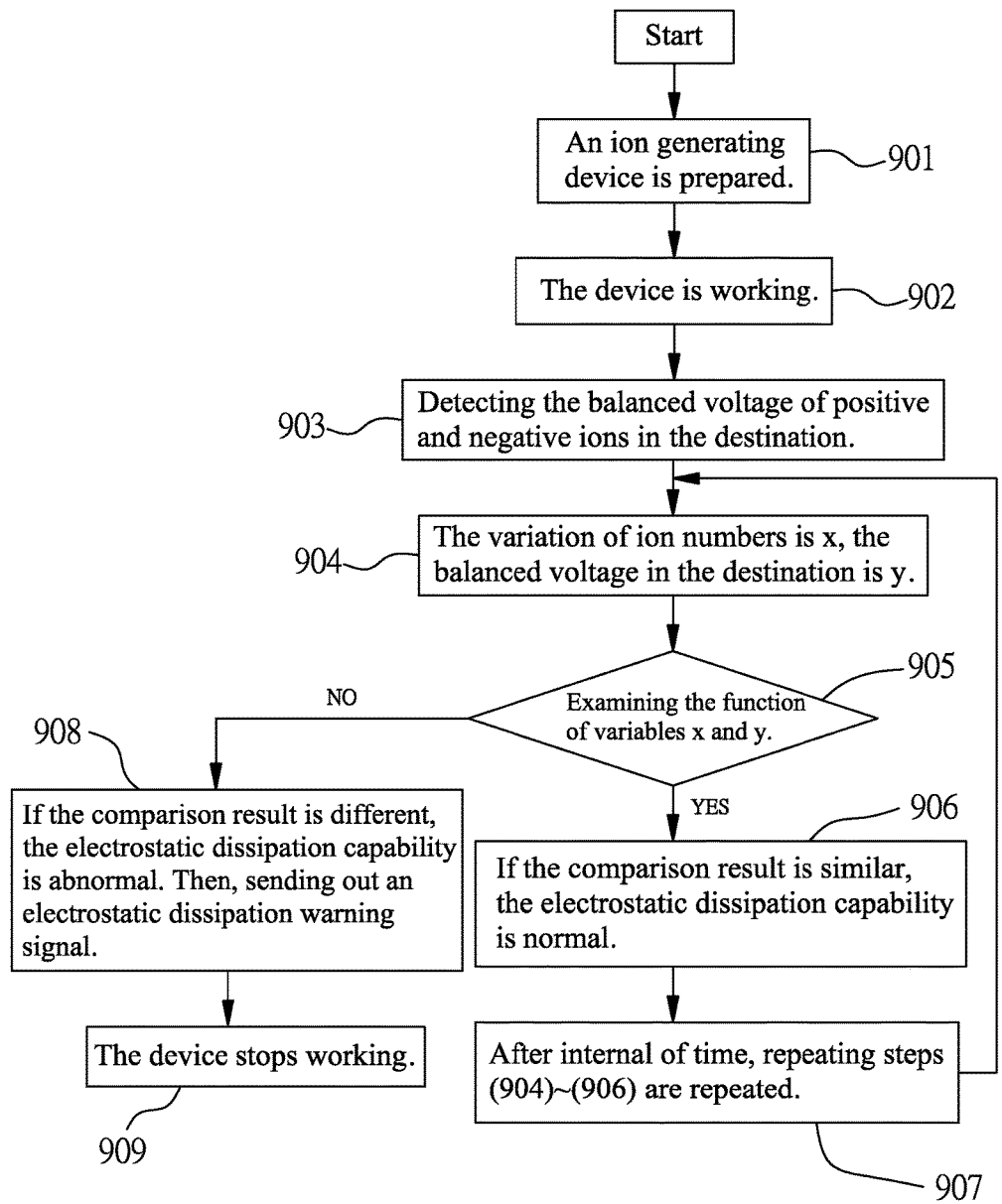
FIG. 3 is a flow chart depicting a first embodiment according to the present invention.
Figure 4:
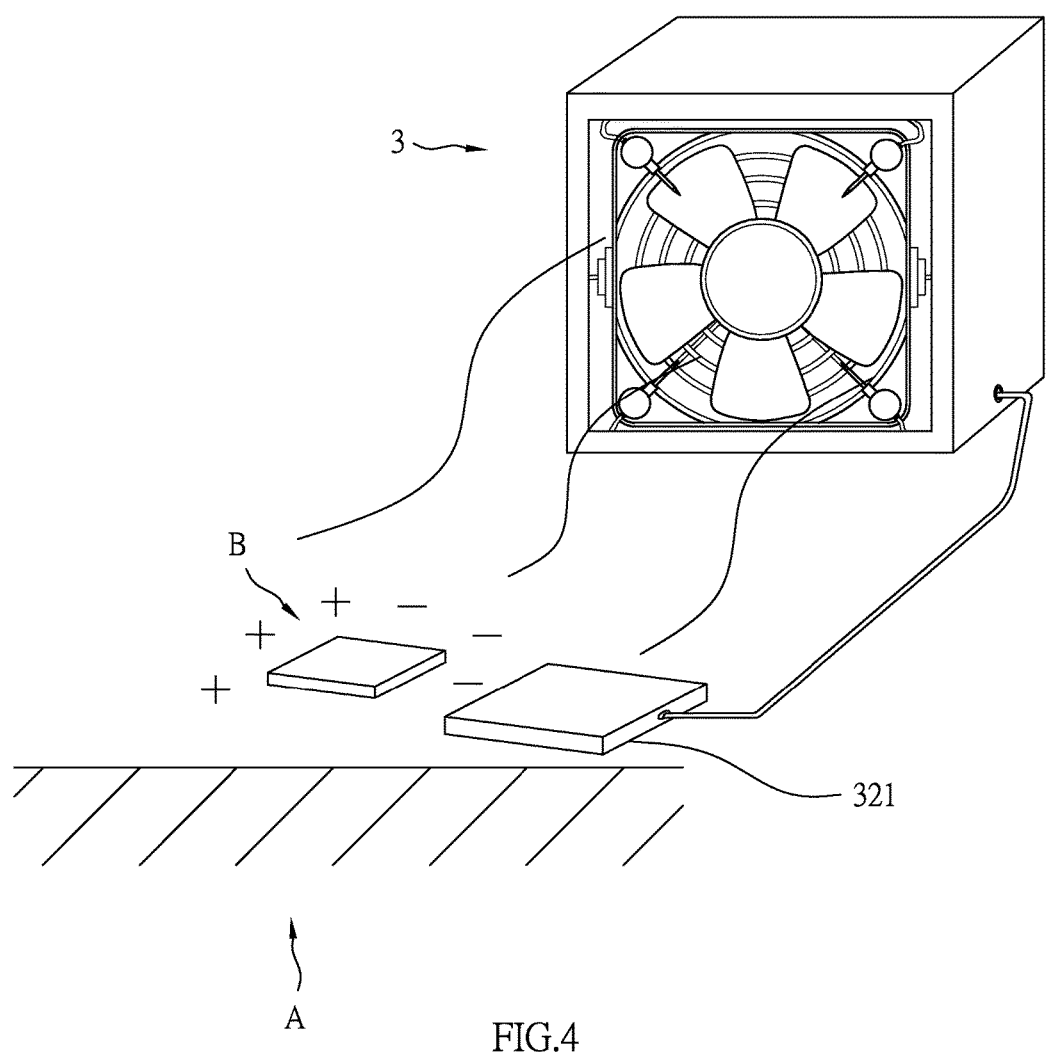
FIG. 4 is a schematic diagram depicting the implementation of an ion generating device in the first embodiment.

With reference to FIGS. 3 and 4, a self-testing method of the electrostatic dissipation capability for the ion generating device 3 includes the following steps: initially, in step 901, the ion generating device 3 is prepared.

In step 902, a constant of proportionality k=y/x is preinstalled in the controller 311 which controls the positive ion generating circuit 331 and the negative ion generating circuit 332 to discharge plural positive and negative ions. The airflow generator 333 directs the plural positive and negative ions from the positive and the negative ion generating circuits 331, 332 to a destination A, where a semiconductor B is placed. It is used to neutralize electrostatic discharge in the semiconductor B and prevent the semiconductor B from electrostatic damage.

In step 903, the detecting element 321 detects the balanced voltage at destination A and responds with the detecting result to the controller 311.

In step 904, the controller 311 controls the positive ion generating circuit 331 and the negative ion generating circuit 332 to increase or decrease their respective discharged ion amounts. In the first embodiment, the variation of the number of positive and negative ions generated by circuits 331 and 332 is x and the balanced voltage detected by the detecting element 321 at the destination A is y.

In step 905, the controller 311 compares the function of variables x and y with the preinstalled constant of proportionality to determine whether they are similar.

If the comparison result is similar, continuing to step 906, the electrostatic dissipation capability of the ion generating device 3 is determined to be normal.

Normally, the balanced voltage at the destination A is close to 0V; increasing the number of positive or negative ions in a unit of time will change the balanced voltage at the destination A, and the balanced voltage will be changed by the variation of positive and negative ions in accordance with the function of variables x and y. Through the above method, it can be estimated whether the ion generating device is normal or not. Then, in step 907, after an interval of time, the steps from 904 to 906 are repeated to examine the electrostatic dissipation capability of the ion generating device 3. In the first embodiment, the examination is performed every hour.

If the comparison result is different, then continuing to step 908, the controller 311 sends out an electrostatic dissipation warning signal to notify the user of the abnormal electrostatic dissipation capability of the ion generating device 3.

In step 908, the comparison result allows a margin of error of ±5%, within this margin of error, the controller does not send out the electrostatic dissipation warning signal.

Finally, in step 909, confirming that the electrostatic dissipation capability is abnormal, the controller 311 can control the positive ion generating circuit 331 and the negative ion generating circuit 332 to stop discharging plural ions, at this time, the ion generating device 3 will be shut down to avoid directing ions to the semiconductor B.

It is to be understood that when in the manufacturing line, in step 908 regarding sending out the electrostatic dissipation warning signal, it also can be cancelled, once an abnormal electrostatic dissipation capability in the ion generating device 3 is found, the incorrect positive and negative ion numbers are stopped from being provided and are not directed to the semiconductor B.

Figure 5:
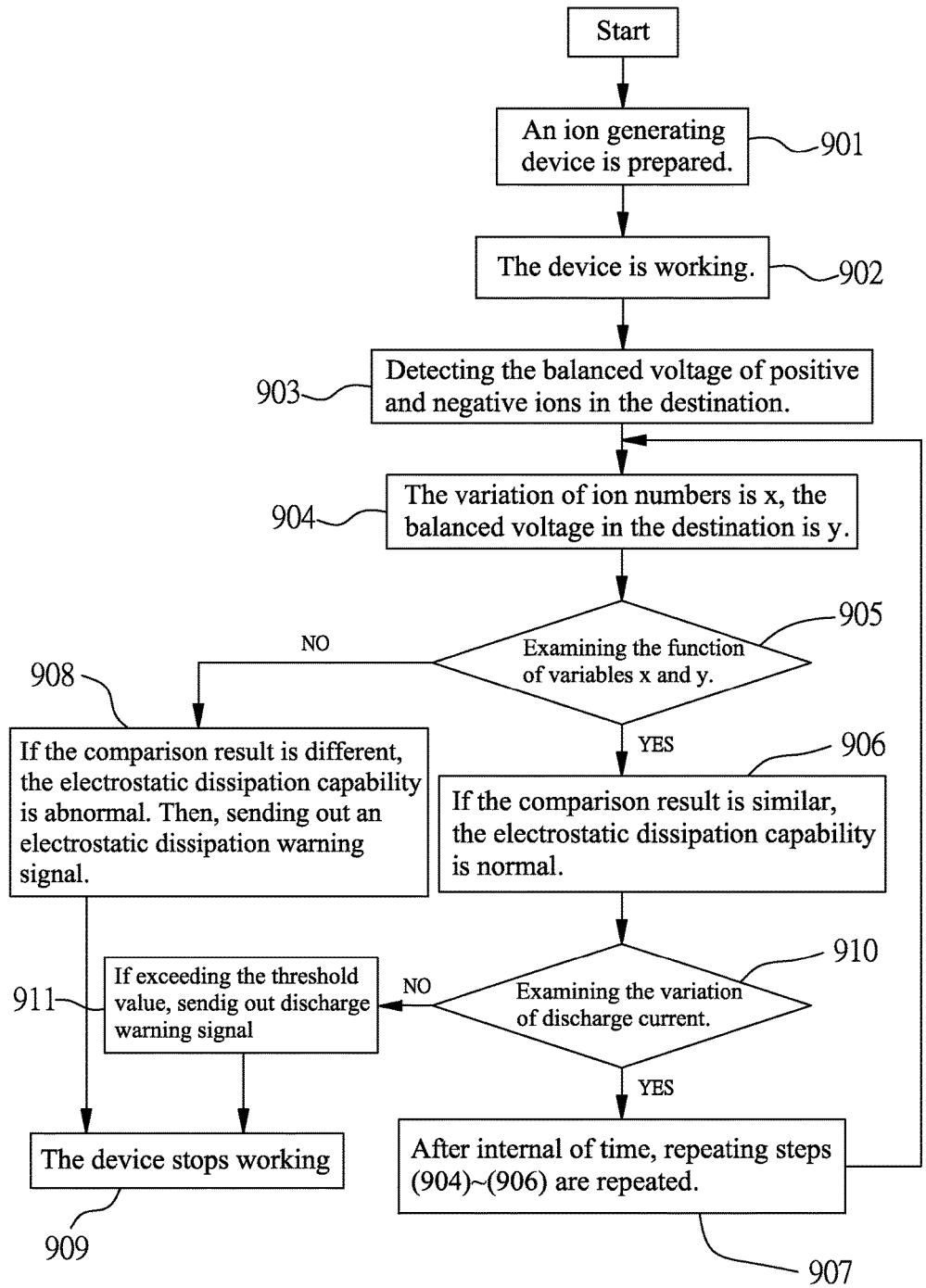
FIG. 5 is a flow chart depicting a second embodiment according to the present invention.

Please refer to FIGS. 2, 4 and 5, a second embodiment according to the present invention is depicted. The second embodiment is similar to the first one, and so features are not described again. Regarding the differences, they include a step 910 between steps 906 and 907, in which the controller 311 detects whether the discharge current in the positive and the negative generating circuits 311 and 332 exceeds a threshold value. If not, then continue to step 907, otherwise, continue to step 911. In the second embodiment, the threshold value is 10% of the discharge current of the positive and the negative ion generating circuits 331 and 332.

In step 911, the controller 311 sends out a discharge warning signal to notify the user of the abnormal discharge situation in the positive and negative ion generating circuits 331 and 332. In normal situations, when the discharge current variation in the positive and the negative ion generating circuits 331 and 332 is severe, it can be presumed that the positive and the negative ion generating circuits 331 and 332 are contaminated (such as their ion discharge needles) or are out of order. Therefore, when users receive the discharge warning signal, they can immediately repair the positive and the negative ion generating circuits 331 and 332 to ensure the quality of the products.

In steps 903, 908 and 911, the controller 311 can continually record and output the balanced voltage at the destination A, and with each variation of electrostatic dissipation warning signal and discharge warning signal, it can let users examine whether the positive and the negative ion generating circuit 331 and 332 is contaminated or needs to be replaced. Collecting the output record of the controller 311 can be utilized for maintenance and product traceability.

With the above mentioned description, the following benefits can be obtained:

1. Providing an active examination of electrostatic dissipation capability:

The controller 311 can compare the function of variables x and y with the constant of proportionality and examine whether the electrostatic dissipation capability of the ion generating device 3 is malfunctioning or not.

2. Providing an active examination of the positive and the negative circuits:

The controller 311 can detect variations of the positive and the negative ion generating circuits 331 and 332, confirming whether the discharge current variation exceeds the threshold value. Therefore, the controller 311 can actively monitor the positive and the negative ion generating circuits 331 and 332 by confirming whether the positive and the negative ion generating circuits 331 and 332 are damaged or out of order.

3. Ensuring product quality:

Confirming the abnormal electrostatic dissipation capability or abnormal discharging of the positive and the negative ion generating circuits, the controller 311 can immediately control the positive ion generating circuit 331 and the negative ion generating circuit 332 to stop releasing positive and negative ions. It can prevent improper amounts of positive and negative ions from being directed to the semiconductor B and protect the semiconductor B from electrostatic damage, and so product quality is ensured.

4. Reducing costs and increasing production efficiency:

When the controller 311 examines the electrostatic dissipation capability, it doesn't need to stop the manufacturing line or empty out products, but can undergo examination during manufacturing; the semiconductor equipment and manufacturing process won't be impacted, and labor is reduced to increase production efficiencies. Therefore, it can ensure production lead times and assist industries with controlling their manufacturing processes.

In sum, regarding the self-testing method of the electrostatic dissipation capability for the ion generating device 3, the controller 311 can compare the function of variables x and y with the constant of proportionality and determine whether the electrostatic dissipation capability of the ion generating device 3 is malfunctioning or not. Furthermore, when examining the electrostatic dissipation capability, it is not necessary to stop the manufacturing line or empty out products, but the examination can be performed while manufacturing to ensure the production quality of the semiconductor B. Consequently, labor is reduced to increase production efficiencies and it can ensure production lead times to assist the industries with controlling their manufacturing processes. Therefore, the above methods can achieve the objective of the present invention.

The foregoing detailed description is merely in relation to two preferred embodiments and shall not be construed as limiting the invention. It is to be understood that many other possible modifications and variations can be made without departing from the spirit and scope of the invention as hereinafter claimed.

What is claimed is:

1. A self-testing method of an electrostatic dissipation capability for an ion generating device, the method comprising:
   (a) providing an ion generating device including a controller, a positive and a negative ion generating circuit electrically connected to the controller, an airflow generator, and a detecting element;
   (b) providing the controller with a non-zero constant of proportionality k, controlling positive and negative ions discharged by the positive and the negative ion generating circuits, and the airflow generator directing the positive and negative ions to a destination;
   (c) the detecting element detecting a voltage at the destination, and responding with a detecting result to the controller;
   (d) the controller controlling the positive and the negative ion generating circuits to increase or decrease a respective number of ions, the controller determining a variation of the number of ions as a variable x, and determining the voltage at the destination detected by the detecting element as a variable y;
   (e) the controller determining a value comprising a ratio of the variables x and y and comparing the value with the constant of proportionality k to determine whether they are similar; and
   (f) if the comparison result is similar, then the electrostatic dissipation capability of the ion generating device is determined to be normal.

2. The self-testing method as claimed in claim 1, further including a step (g), wherein after an interval of time, the steps from (d) to (f) are repeated.

3. The self-testing method as claimed in claim 2, further including a step (h) wherein if the comparison result is not similar, then the controller sends out an electrostatic dissipation warning signal to notify a user of an abnormal electrostatic dissipation capability of the ion generating device.

4. The self-testing method as claimed in claim 3, wherein in step (h), the comparison result allows a margin of error of ±5%, and within the margin of error the controller does not send out the electrostatic dissipation warning signal.

5. The self-testing method as claimed in claim 4, further including a step (i), wherein the controller controls the positive and the negative ion generating circuits to stop discharging positive and negative ions.

6. The self-testing method as claimed in claim 5, wherein the interval of time is 1 hour.

7. The self-testing method as claimed in claim 6, further including a step (j) between step (f) and (g), comprising determining whether a discharge current in the positive and the negative ion generating circuits exceeds a threshold value, and if not then continuing to step (g), otherwise, performing step (i), in which the controller controls the positive and the negative ion generating circuits to stop discharging positive and the negative ions.

8. The self-testing method as claimed in claim 7, further including a step (k) between steps (j) and (i), wherein the controller sends out a discharge warning signal to notify the user of an abnormal discharge situation in the positive or the negative ion generating circuits.

9. The self-testing method as claimed in claim 8, wherein in step (j), the threshold value is 10% of a normal discharge current.

10. The self-testing method as claimed in claim 9, wherein among steps (c), (h) and (k), the controller continually records and outputs the voltage at the destination, and each variation of electrostatic dissipation warning signal and discharge warning signal.

11. The self-testing method as claimed in claim 1, further including a step (h) between steps (e) and (f), wherein if the comparison result is not similar, then the controller sends out an electrostatic dissipation warning signal to notify a user of an abnormal electrostatic dissipation capability of the ion generating device.

12. The self-testing method as claimed in claim 11, wherein in step (h), the comparison result allows a margin of error of ±5%, and within the margin of error the controller does not send out the electrostatic dissipation warning signal.

13. The self-testing method as claimed in claim 12, further including a step (i), wherein the controller controls the positive and the negative ion generating circuits to stop discharging positive and negative ions.

14. The self-testing method as claimed in claim 13, further including a step (j) comprising determining whether a discharge current in the positive and the negative ion generating circuits exceeds a threshold value, and performing a step (i), in which the controller controls the positive and the negative ion generating circuits to stop discharging positive and the negative ions if the discharge current exceeds the threshold value.

15. The self-testing method as claimed in claim 14, further including a step (k) between steps (j) and (i), wherein the controller sends out a discharge warning signal to notify the user of an abnormal discharge situation in the positive or the negative ion generating circuits.

16. The self-testing method as claimed in claim 15, wherein in step (j), the threshold value is 10% of a normal discharge current.

17. The self-testing method as claimed in claim 16, wherein among steps (c), (h) and (k), the controller continually records and outputs the voltage at the destination, and each variation of electrostatic dissipation warning signal and discharge warning signal.

* * * * *